United States Patent
Teraguchi

(12) 
(10) Patent No.: US 6,348,704 B1
(45) Date of Patent: Feb. 19, 2002

(54) SEMICONDUCTOR DEVICE HAVING SUCCESSFUL SCHOTTKY CHARACTERISTICS

(75) Inventor: Nobuaki Teraguchi, Kusatsu (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/641,818

(22) Filed: Aug. 18, 2000

(30) Foreign Application Priority Data

Aug. 19, 1999 (JP) ............................................. 11-232654

(51) Int. Cl.$^7$ ..................... H01L 31/072; H01L 31/109;
     H01L 31/0328; H01L 31/0336
(52) U.S. Cl. ......................... 257/197; 257/187; 257/615
(58) Field of Search ............................. 257/187, 197, 257/198, 615

(56) References Cited

U.S. PATENT DOCUMENTS 5,670,798 A * 9/1997 Schetzina .................... 257/96

FOREIGN PATENT DOCUMENTS

| JP | A62177972 | 8/1987 |
| JP | A6296013 | 10/1994 |
| JP | A6333938 | 12/1994 |

OTHER PUBLICATIONS

D. Kahng, "Proceeding of the IRE 50," p. 1534, (1962).
Electronics Letters, vol. 20, no. 19, pp. 762–764, (Sep. 13, 1984).
J.C. Hensel et al, "Appl. Phys. Lett. 47 (2)," pp. 151–153, (Jul. 15, 1985).
M. Tanaka et al, "Appl. Phys. Lett. 68 (1)," pp. 84–86, ( Jan. 1, 1996).
C.Y. Hung et al, "Journal of Crystal Growth 169," pp. 201–208 (1996).
Carl O. Bozler et al, "IEEE Transactions on Electron Devices," vol. Ed–27, No. 6, pp. 1128–1141, (Jun. 1980).

* cited by examiner

Primary Examiner—Ngân V. Ngô

(57) ABSTRACT

Each layer of a three-layer structure composed of semiconductor (collector layer 13)/metal (base layer 14)/semiconductor (emitter layer 15) is formed from a nitride. By so doing, one identical constituent element (N) is contained in both semiconductor layers and the metal layer. Because Nb of the NbN base layer 14 combines with N to form a nitride at a stoichiometric ratio of 1:1, the resulting metal nitride and nitride semiconductor exhibit the same stoichiometric ratio. Therefore, it becomes possible to form the base layer 14 and the emitter layer 15 spatially continuously (interface bonding of 1:1), so that a successful Schottky junction can be obtained. As a result, an MBT superior in electrical characteristics can be obtained. Thus, the semiconductor device has successful Schottky characteristics so that superior characteristics can be obtained.

9 Claims, 6 Drawing Sheets

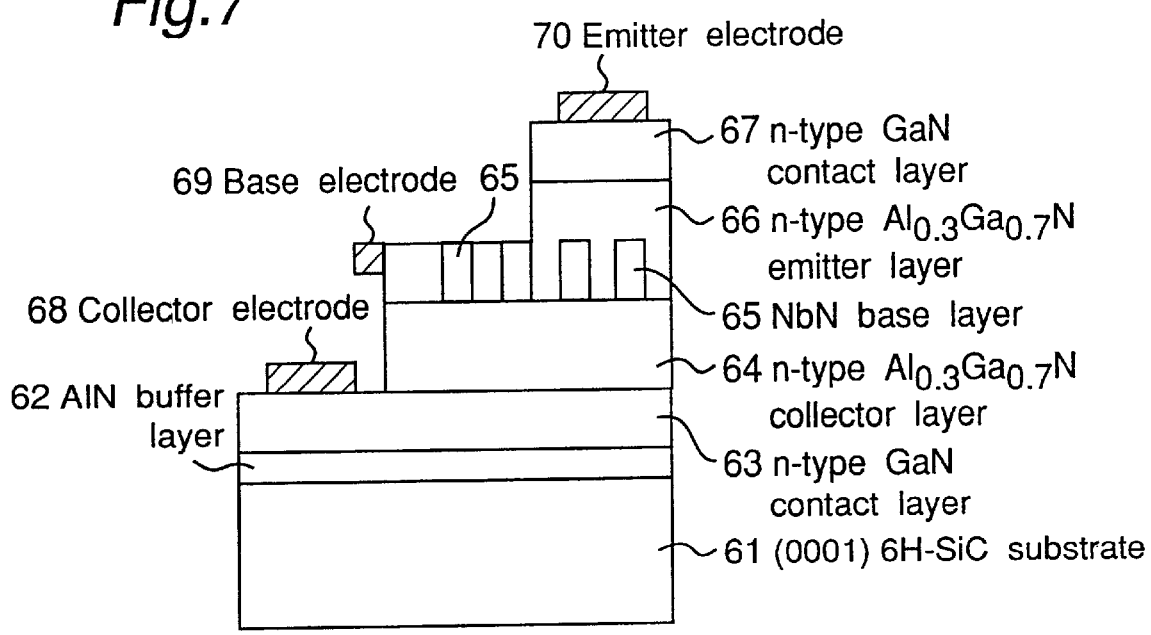
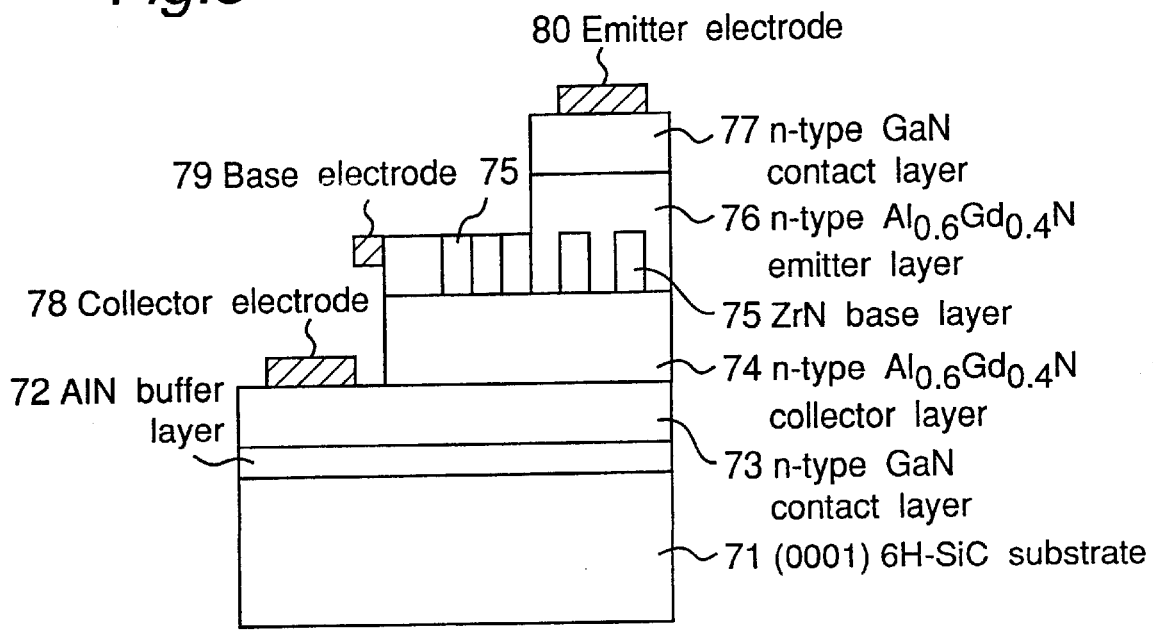

SEMICONDUCTOR DEVICE HAVING SUCCESSFUL SCHOTTKY CHARACTERISTICS

BACKGROUND OF THE INVENTION

The present invention relates to semiconductor devices using nitride-based compound semiconductors and, more particularly, to a transistor having a semiconductor/metal/semiconductor structure in which both-side semiconductors and the metal form a Schottky junction. Among such transistors are metal base transistors (MBTs) and permeable base transistors (PBTs)

Studies on MBTs began as early as 1961. The basic band structure is as shown in FIG. 10. This MBT has a structure in which the base is formed of metal with a view to avoiding any increase in base resistance due to reduction of base width, which has been an issue in conventional transistors. In this case, there is a need of forming a Schottky junction between the base metal and both-side semiconductors.

In early studies, there were insufficiencies in techniques for forming semiconductors having enough crystallinity and successful semiconductor/metal interfaces. As a result, it was difficult to form MBTs having successful characteristics (Proceed. IRE 50 (1962) 1534).

Through further studies, MBTs in Si/silicide/Si structures were studied. However, there have been developed no transistors having a large current amplification factor because of pinholes of silicide (Electronics Lett. 20 (1984) 762), (Appl. Phys. Lett. 47 (1985) 151). In addition to this, studies on a combination of ErAs/AlAs (Appl. Phys. Lett. 68 (1996) 84), and a combination of NiAl/GaAs (J.Cryst. Growth 169 (1996) 201) and the like have been made, but successful Schottky characteristics have not been obtained because of poor crystallinity of AlAs or GaAs grown on ErAs or NiAl.

Also, in the PBT, as shown in FIG. 11, a base metal 1 is stripe patterned and, as in the MBT, forms a Schottky junction with an emitter 2 or a collector 3 around the base metal 1 (IEEE Trans. Electron Devices ED-27 (1980) 1128). It is noted that reference numeral 4 denotes an emitter electrode and 5 denotes a collector electrode.

In the conventional PBT, gallium arsenide (GaAs) is used as the semiconductors 2, 3, and tungsten (W) is used as the base metal 1. In observing vicinities of the base metal 1, there can be seen a void 6 where the emitter (GaAs) 2 has not been epitaxially grown on the base metal (W) 1 as shown in FIG. 12. As a result, ideal characteristics have not been obtained.

As the base metal of the MBT or PBT, there have been proposed those using hexaborides of rare earth elements (e.g. $LaB_6$) (Japanese Patent Laid-Open Publication SHO 62-177972), those using metal oxides such as BiRbBaO (Japanese Patent Laid-Open Publication HEI 06-296013), and those using Pt, Pd or Ni (Japanese Patent Laid-Open Publication HEI 06-333938).

As described above, in order to materialize MBTs and PBTs having superior characteristics, the following three issues need to be solved. One of those issues is pinholes that occur to the metal layer. By obtaining a pinhole-free metal layer, all the carriers that are transported from emitter to collector come into hot electrons, allowing transistor characteristics to be enhanced.

Another issue is crystallinity of the semiconductor layer formed on the metal layer. It is relatively easy to grow a metal layer having successful crystallinity on the semiconductor layer having a diamond structure or zinc-blende structure. However, when a semiconductor layer having a diamond structure or zinc-blende structure is grown on the metal layer, there would occur a multiplicity of crystal defects due to antiphase domains for the reason that a polar material is grown on a nonpolar material. As a result, the crystallinity of the semiconductor layer grown on the metal layer would deteriorate to a considerable extent, so that an ideal Schottky junction would not be formed.

The final issue is how to eliminate voids that would occur just above W when the metal (W) is buried into the semiconductor layer. Basically, because the metal (W) is polycrystalline and because the relationship of epitaxial growth is not satisfied between W and semiconductor, there would not be grown a semiconductor layer on the striped metal layer. Whereas semiconductor 2a at portions where the metal layer 1 is absent are grown so as to go around onto the metal layer 1 so that the metal layer 1 is buried as shown in FIGS. 13A–13D, a void 6 to be formed on the metal layer 1 upon contact between the semiconductor 2a, 2a that has gone around from both sides of the metal layer 1 does not completely eliminated. Therefore, in order to make a perfect buried state without the presence of the void 6 on the metal layer 1, the relationship of epitaxial growth needs to be satisfied between the metal layer 1 and the semiconductor layer 2.

Also, in the case where hexaborides of rare earth elements, metal oxides such as BiRbBaO, or metals such as Pt are used as the base material, there would be problems as follows. That is, because crystalline structure (zinc-blende structure or wurtzite structure) and lattice constant of borides or oxides are different from those of general semiconductor, the difference of crystallinity of the emitter layer and the collector layer would be large. As a result, base-emitter electrical characteristics and base-collector electrical characteristics would be largely different from each other.

SUMMARY OF THE INVENTION

Accordingly, an object of the present invention is to provide a semiconductor device having successful Schottky characteristics and exhibiting excellent characteristics.

In order to achieve the above object, there is provided a semiconductor device which comprises a three-layer structure composed of a nitride-based compound semiconductor, a metal nitride and a nitride-based compound semiconductor.

In this constitution, since the layers of the three-layer structure of semiconductor/metal/semiconductor are given by nitrides, one identical constituent element is contained in both semiconductor layers and the metal layer, thus making it possible to achieve a spatially continuous crystal growth. Therefore, a semiconductor of good crystallinity is formed, and a successful Schottky junction is obtained. As a result, a semiconductor device superior in electrical characteristics can be obtained.

In one embodiment of the present invention, the metal nitride is formed into a striped shape.

In this constitution, since one identical constituent element is contained in the individual layers of the semiconductor layer/metal layer/semiconductor layer, a spatially continuous crystal growth is enabled so that a semiconductor of good crystallinity can be formed. Therefore, an ideal interface with less voids, as can be seen in GaAs-W, is obtained on the striped metal nitride, and a PBT superior in electrical characteristics can be obtained.

In one embodiment of the present invention, the metal nitride is formed into a meshed shape.

In this constitution, as in the case of striped shape, an ideal interface with less voids is obtained on the meshed metal nitride, and a PBT superior in electrical characteristics can be obtained. Further, in the case where the metal nitride is formed into a meshed shape, even if part of lead-out portion to electrodes is disconnected for some reason, the other of the portion keeps contact, thus eliminating any effects of the disconnection on characteristics. Therefore, there is no need of enlarging the lead-out portion.

In one embodiment of the present invention, metal of the metal nitride is at least one selected from among niobium, tantalum, chromium, zirconium, titanium and vanadium.

In this constitution, because Nb, Ta, Cr, Zr, Ti and V combine with nitrogen to form nitrides at a stoichiometric ratio of 1:1, the resulting metal nitride and the nitride-based compound semiconductor show the same stoichiometric ratio. Therefore, the metal nitride and the nitride-based compound semiconductor can be formed spatially continuously (interface bonding of 1:1), so that an ideal metal/semiconductor interface free from occurrence of dangling bonds and the like can be obtained. As a result, a semiconductor device more superior in electrical characteristics can be obtained.

In one embodiment of the present invention, the nitride-based compound semiconductor is AlGaInN with lanthanoid added thereto.

In this constitution, since the lattice constant can arbitrarily be changed by adding lanthanoid to AlGaInN, the lattice matching between the nitride-based compound semiconductor and the metal nitride becomes controllable. Therefore, crystallinity of the nitride-based compound semiconductor is improved, and a semiconductor device more superior in electrical characteristics can be obtained.

In one embodiment of the present invention, the lanthanoid-added AlGaInN and the metal nitride are formed in such a way that a (0001) plane of the lanthanoid-added AlGaInN and a (111) plane of the metal nitride are parallel to each other.

In this constitution, the (0001) plane (c plane) of the lanthanoid-added AlGaInN whose crystal structure is a wurtzite structure, and the (111) plane of the metal nitride whose crystal structure is an halitic (lock solt) structure become the same close-packed planar structure so that the epitaxial relationship is satisfied. Therefore, by such a crystal growth that the (0001) plane of the lanthanoid-added AlGaInN and the (111) plane of the metal nitride become parallel to each other, a successful crystallinity can be obtained.

Particularly in the case of the PBT, since the epitaxial relationship between the metal nitride and the lanthanoid-added AlGaInN is satisfied, the adhesion of the metal nitride with the lanthanoid-added AlGaInN provided thereon is improved, so that an ideal interface having almost no voids can be obtained.

In one embodiment of the present invention, the nitride-based compound semiconductor is a nitride of lanthanoid.

In this constitution, with an halitic structure adopted, when the nitride-based compound semiconductor is given by a lanthanoid nitride whose orientation of growth is unselected so as to be of the same crystal structure as the metal nitride, it becomes possible to obtain a crystallinity successful in every orientation.

In one embodiment of the present invention, the lanthanoid is at least one selected from among lanthanum, cerium, praseodymium, neodymium, prometium, samarium, europium, gadolinium, terbium, dysprosium, holmium, erbium, thulium, ytterbium and lutetium.

In this constitution, when Gd, Tb, Dy, Ho or Er, which is more stable in trivalent state, is added to AlGaInN, a more stable lanthanoid-added AlGaInN can be obtained. Also, even with any lanthanoid for use as a nitride, a crystallinity successful in every orientation can be obtained. Further, since the lanthanoid is a high melting point metal, the resulting nitride-based compound semiconductor itself becomes more stable to temperature.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 7 is a sectional structural view of a PBT other than that of FIG. 6;

FIG. 8 is a sectional structural view of a PBT other than those of FIGS. 6 and 7;

DETAILED DESCRIPTION OF THE PREFERRED EMBODIMENTS

Hereinbelow, the present invention is described in detail by way of embodiments thereof illustrated in the accompanying drawings. It is noted that the present invention is by no means limited by these embodiments.

(First Embodiment)

Figure 1:
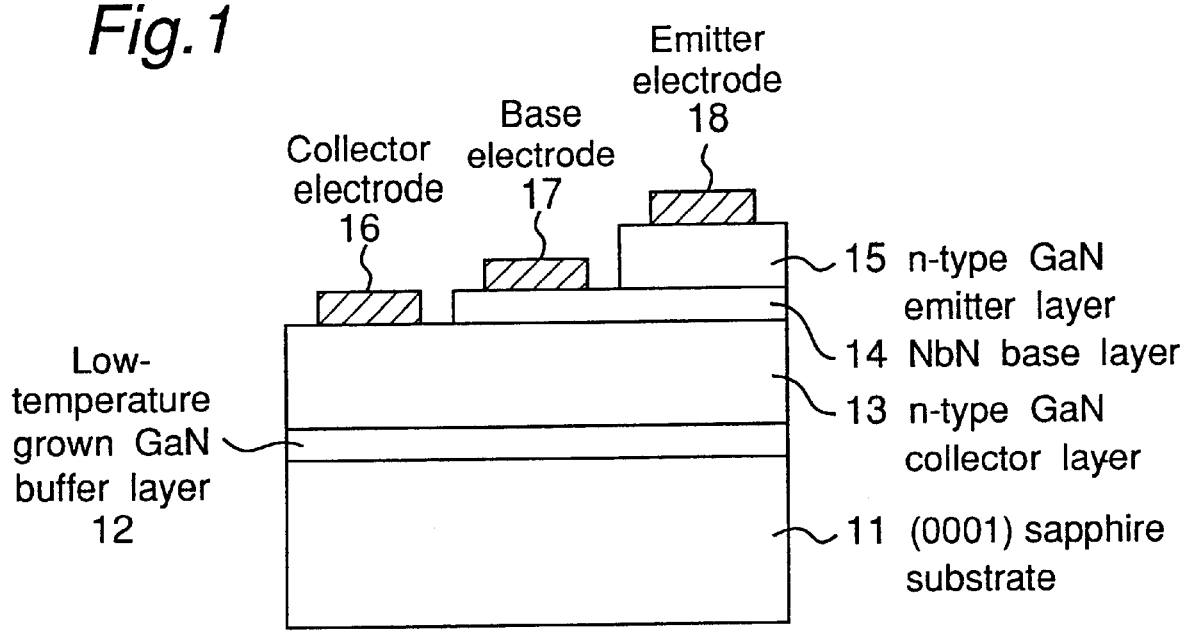
FIG. 1 is a sectional structural view of an MBT as a semiconductor device of the present invention.

FIG. 1 shows a cross-sectional structure of an MBT as a semiconductor device of this embodiment. In FIG. 1, reference numeral 11 denotes a (0001) sapphire substrate, 12 denotes a low-temperature grown GaN buffer layer (film thickness: 20 nm), 13 denotes an n-type GaN collector layer (carrier concentration: $5\times10^{17}$ cm$^{-3}$, film thickness: 0.5 $\mu$m), 14 denotes a NbN (niobium nitride) base layer (film thickness: 30 nm), 15 denotes an n-type GaN emitter layer (carrier concentration: $1\times10^{18}$ cm$^{-3}$, film thickness: 0.2 $\mu$m), 16 denotes a collector electrode, 17 denotes a base electrode, and 18 denotes an emitter electrode.

As a crystal growth method for forming this layered structure, metallorganic vapor phase epitaxy process (MOVPE process), molecular beam epitaxy process (MBE process) using plasma-excited nitrogen, and the like are available. In this embodiment, the film structure was fabricated by RF-MBE process. The RF-MBE process is as follows.

First of all, a substrate is cleaned for 10 minutes at a substrate temperature of 800° C. in a vacuum. Next, with the substrate temperature set to 550° C., nitrogen radicals (nitrogen flow rate: 1 sccm, plasma power: 300 W) are applied to the sapphire substrate 11, by which surface nitriding is performed for improving crystal growth (time: 1 hr.), and thereafter, a GaN buffer layer 12 is grown. Next, with the substrate temperature elevated to 750° C., an n-type GaN collector layer 13, an NbN base layer 14 and an n-type GaN emitter layer 15 are grown sequentially. Thus, an MBT is obtained.

The MBT formed in this way has a three-layer structure composed of semiconductor (collector layer)/metal (base layer)/semiconductor (emitter layer), each layer of the structure being made of nitride. Therefore, both semiconductor layers and the metal layer have the same constituent element, N. Further, because Nb, Ta, Cr, Zr, Ti and V combine with nitrogen to form nitrides at a stoichiometric ratio of 1:1, the resulting metal nitride and the nitride semiconductor as the collector layer 13 and the emitter layer 15 show the same stoichiometric ratio. Therefore, the base layer 14 and the emitter layer 15 can be formed spatially continuously (interface bonding of 1:1), so that an ideal, successful Schottky junction free from occurrence of dangling bonds can be obtained. As a result, an MBT superior in electrical characteristics can be obtained.

Figure 2:
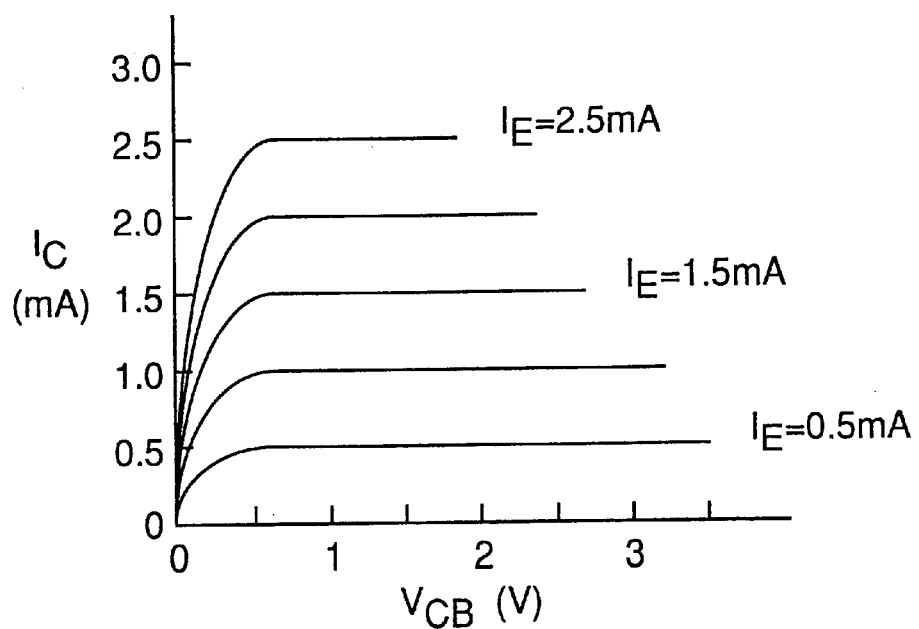
FIG. 2 is a chart showing $V_{CB}$-$I_C$ characteristics of the MBT shown in FIG. 1.

FIG. 2 shows base-collector voltage–collector current characteristics ($V_{CB}$–$I_C$ characteristics) of the MBT made in the above way. As a grounded emitter current amplification factor β, a value of β=100 was obtained, finding largely exceeding conventional MBT characteristics (β≈1). This could be attributed to the fact that a pinhole-free metal layer was able to be realized by the achievement of the ideal Schottky junction as described above.

(Second Embodiment)

Figure 3:
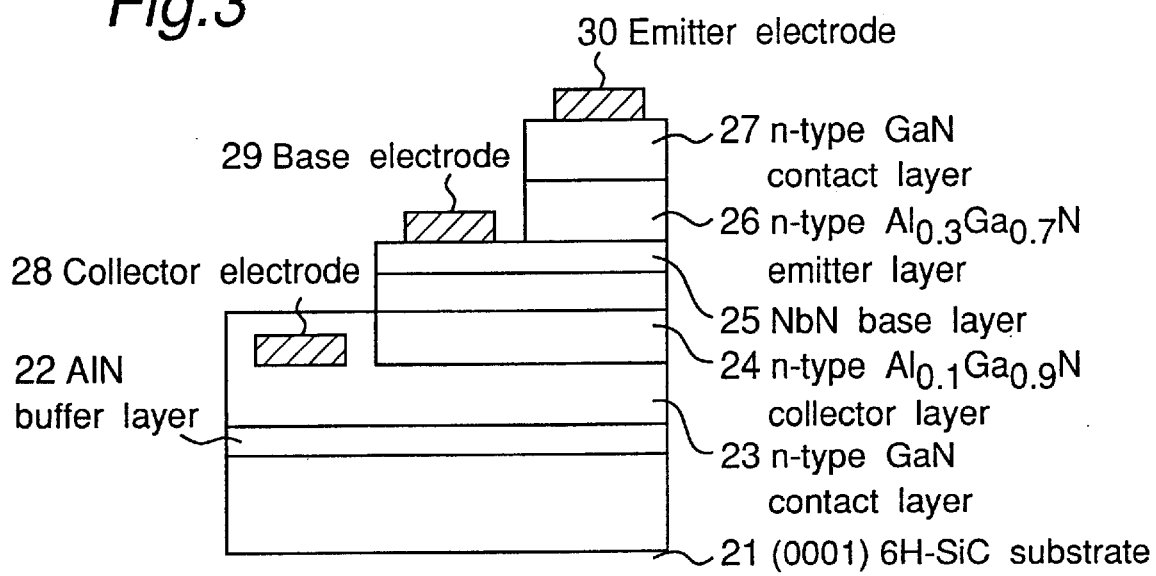
FIG. 3 is a sectional structural view of an MBT other than that of FIG. 1.

FIG. 3 shows a cross-sectional structure of an MBT according to this embodiment. In FIG. 3, reference numeral 21 denotes a (0001) 6H—SiC substrate, 22 denotes an AlN buffer layer (film thickness: 20 nm), 23 denotes an n-type GaN contact layer, 24 denotes an n-type $Al_{0.1}Ga_{0.9}N$ collector layer (carrier concentration: $5 \times 10^{17}$ cm$^{-3}$, film thickness: 0.5 μm), 25 denotes a NbN base layer (film thickness: 30 nm), 26 denotes an n-type $Al_{0.3}Ga_{0.7}N$ emitter layer (carrier concentration: $1 \times 10^{18}$ cm$^{-3}$, film thickness: 0.2 μm), 27 denotes an n-type GaN contact layer, 28 denotes a collector electrode, 29 denotes a base electrode, and 30 denotes an emitter electrode.

As a crystal growth method for forming this layered structure, MOVPE process, MBE process using plasma-excited nitrogen, and the like are available. In this embodiment, the film structure was fabricated by RF-MBE process as in the first embodiment.

As a result, a value of the grounded emitter current amplification factor β=180 was obtained, hence an improvement in characteristics by virtue of the use of AlGaN as the collector layer 24 and the emitter layer 26. This could be attributed to an improved crystallinity obtained by virtue of the fact that the lattice constant (3.13 Å) of $Al_{0.3}Ga_{0.7}N$ is closer to the lattice constant (2.97 Å) of NbN as the base layer 25 than the lattice constant (3.16 Å) of GaN as the contact layer 27. Further, by virtue of the collector layer 24 being smaller in Al composition than the emitter layer 26, the base-collector barrier height became lower so that electrons from the emitter layer 26 could be passed to the collector layer 24 more effectively, which contributed to an improvement in characteristics.

(Third Embodiment)

Figure 4:
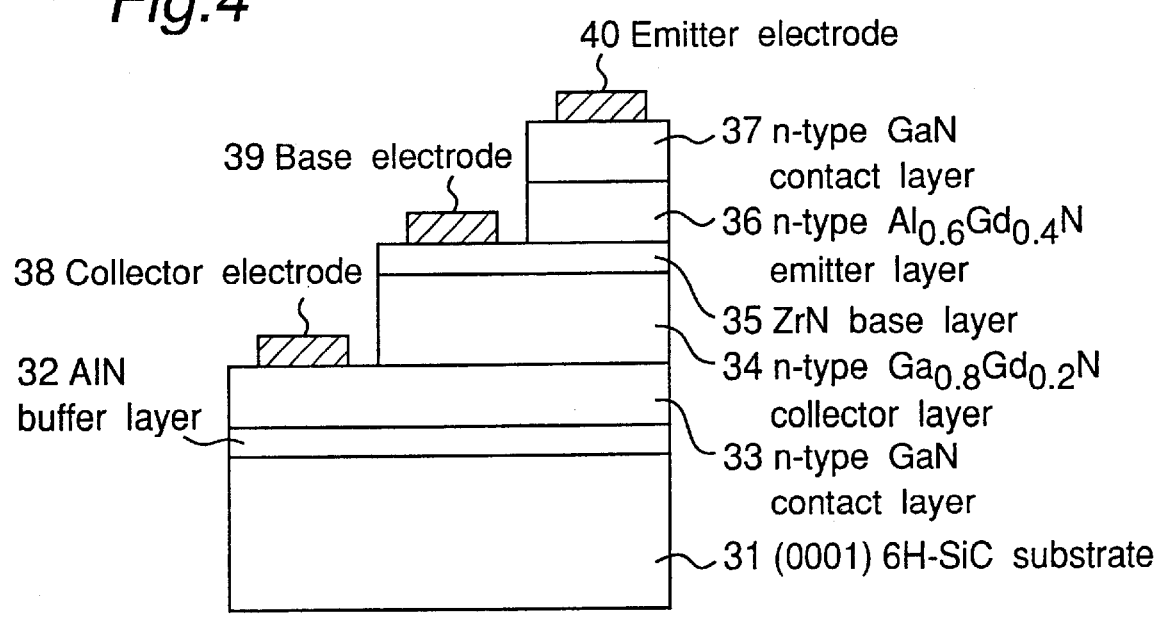
FIG. 4 is a sectional structural view of an MBT other than those of FIGS. 1 and 3.

FIG. 4 shows a cross-sectional structure of an MBT according to this embodiment. The MBT of this embodiment, although basically similar in structure to that of the second embodiment, differs therefrom in that a collector layer 34 is formed from n-type $Ga_{0.8}Gd_{0.2}N$ (carrier concentration: $5 \times 10^{17}$ cm$^{-3}$, film thickness: 0.5 μm), a base layer 35 is formed from ZrN (zircon nitride) (film thickness: 30 nm), and that an emitter layer 36 is formed from n-type $Al_{0.6}Gd_{0.4}N$ (carrier concentration: $1 \times 10^{18}$ cm$^{-3}$, film thickness: 10 nm). It is noted that a substrate 31, a buffer layer 32, a contact layer 33, a contact layer 37, a collector electrode 38, a base electrode 39 and an emitter electrode 40 are similar in constitution to those of the second embodiment.

As a crystal growth method for forming this layered structure, MOVPE process, MBE process using plasma-excited nitrogen, and the like are available. In this embodiment, the film structure was fabricated by RF-MBE process.

As a result, a value of the grounded emitter current amplification factor β=200 was obtained. When the collector layer 34 and the emitter layer 36 are formed from AlGaInN with lanthanoid added thereto, the arbitrariness of band gap and lattice constant are increased as compared with AlGaInN layers, making it easier to form the lattice matching system. In the case of this embodiment, the reason that a large current amplification factor was obtained could be attributed to the fact that the lattice constant (3.26 Å) of the ZrN base layer 35 as a hexagonal, and the lattice constant (3.27 Å) of the n-type $Ga_{0.7}Gd_{0.3}N$ collector layer 34 and the lattice constant (3.26 Å) of the $Al_{0.6}Gd_{0.4}N$ emitter layer 36 were generally in a lattice matching.

In addition, when AlGaInN or lanthanoid-added AlGaInN and metal nitride are laminated together, the limitation is desirably formed in such a manner that the (0001) plane (c plane) of the AlGaInN or lanthanoid-added AlGaInN and the (111) plane of the metal nitride become parallel to each other. This is because the nitride-based compound semiconductor forming the collector layer and the emitter layer, and the metal nitride forming the base layer are different in crystal structure from each other. It is only when the (0001) plane (c plane) of the AlGaInN or lanthanoid-added AlGaInN and the (111) plane of the metal nitride are parallel to each other that successful results can be obtained.

(Fourth Embodiment)

Figure 5:
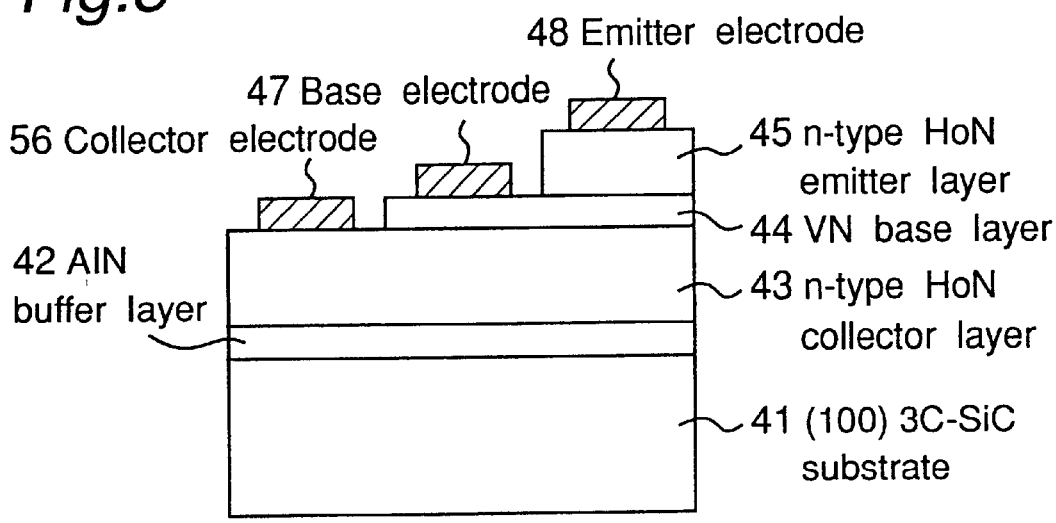
FIG. 5 is a sectional structural view of an MBT other than those of FIGS. 1, 3 and 4.

FIG. 5 shows a cross-sectional structure of an MBT according to this embodiment. In FIG. 5, reference numeral 41 denotes a (100)3C—SiC substrate, 42 denotes an AlN buffer layer (film thickness: 20 nm), 43 denotes an n-type HoN collector layer (carrier concentration: $5 \times 10^{17}$ cm$^{-3}$, film thickness: 0.5 μm), 44 denotes a VN (vanadium nitride) base layer (film thickness: 20 nm), 45 denotes an n-type HoN emitter layer (carrier concentration: $1 \times 10^{18}$ cm$^{-3}$, film thickness: 50 nm), 46 denotes a collector electrode, 47 denotes a base electrode, and 48 denotes an emitter electrode.

In this embodiment, the film structure was fabricated by RF-MBE process. In HoN as the collector layer 43 and the emitter layer 45 as well as VN as the base layer 44 obtained in this embodiment, in which the (100) plane of the cubic SiC substrate is used, their (100) planes of the halitic structure are parallel to the substrate plane. Also, when the collector layer 43 and the emitter layer 45, with an halitic structure adopted, are formed from a lanthanoid nitride (HoN) whose orientation of growth is unselected so as to be of the same crystal structure as the metal nitride (VN), it becomes possible to obtain a crystallinity successful in every orientation.

Therefore, for the MBT obtained in the above way, a value of the grounded emitter current amplification factor β=250 can be obtained. As in this embodiment, when the lanthanoid nitride as the collector layer 43 and the emitter layer 45, and the metal nitride as the base layer 44, are combined together, a more ideal crystal interface can be obtained by virtue of their perfect identicalness in crystal structure. This could be the cause of the large current amplification factor.

In addition, although results from using Ho as the lanthanoid are shown in this embodiment, similar effects were verified even with the use of lanthanoids other than Ho.

(Fifth Embodiment)

Figure 6:
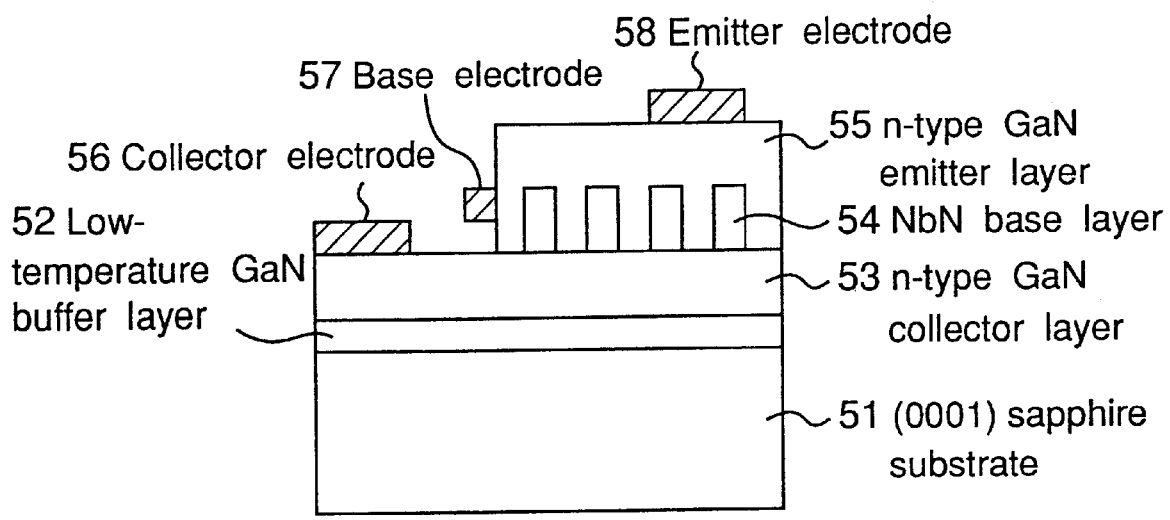
FIG. 6 is a sectional structural view of a PBT as a semiconductor device of the present invention.

FIG. 6 shows a cross-sectional structure of a PBT as a semiconductor device of this embodiment. In FIG. 6, reference numeral 51 denotes a (0001) sapphire substrate, 52 denotes a low-temperature grown GaN buffer layer (film thickness: 20 nm), 53 denotes an n-type GaN collector layer (carrier concentration: $5 \times 10^{16}$ cm$^{-3}$, film thickness: 0.5 μm), 54 denotes a NbN base layer (film thickness: 5 nm), 55 denotes an n-type GaN emitter layer (carrier concentration: $1 \times 10^{17}$ cm$^{-3}$, film thickness: 0.2 μm), 56 denotes a collector electrode, 57 denotes a base electrode, and 58 denotes an emitter electrode.

As a crystal growth method for forming this layered structure, MOVPE process, MBE process using plasma-excited nitrogen, and the like are available. In this embodiment, the film structure was fabricated by RF-MBE process as in the first embodiment. The RF-MBE process is as follows.

First of all, a substrate is cleaned for 10 minutes at a substrate temperature of 800° C. in a vacuum. Next, with the substrate temperature set to 550° C., nitrogen radicals (nitrogen flow rate: 1 sccm, plasma power: 300 W) are applied to the sapphire substrate 51, by which surface nitriding is performed for accelerating crystal growth (time: 1 hr.), and thereafter, a GaN buffer layer 52 is grown. Next, with the substrate temperature elevated to 750° C., an n-type GaN collector layer 53 and an NbN base layer 54 are grown sequentially.

After the RF-MBE process is ended in this way, with the substrate taken out from the MBE equipment, SiO$_2$ is deposited by CVD (Chemical Vapor Deposition) process, and a striped or meshed pattern is formed with resist, and further part of SiO$_2$ is removed with buffer hydrofluoric acid. Next, after the resist is removed, part of the NbN base layer 54 is removed with the SiO$_2$ used as a mask by reactive ion etching (RIE) using chlorine gas, by which a striped or meshed NbN buried base layer is formed.

Thereafter, the substrate is returned to the MBE equipment, and surface-cleaned with nitrogen plasma in the MBE equipment. Then, an n-type emitter layer 55 is grown at a substrate temperature of 750° C.

The PBT obtained in this way showed a maximum oscillating frequency of 50 GHz, which is a value several times larger than that of conventional W-GaAs based PBTs. This could be attributed to the fact that a spatially continuous crystal growth was enabled by virtue of the presence of the same constituent element (N) in the individual layers of the semiconductor layer (collector layer)/metal layer (base layer)/semiconductor layer (emitter layer), and therefore that a nitride semiconductor layer as an emitter layer 55 was epitaxially grown without voids on the metal nitride as the buried base layer 54.

In this connection, in the case where the base layer 54 is formed into a mesh shape, even if part of the lead-out portion to the base electrode 57 is disconnected for some reason, the other of the portion keeps contact, thus eliminating any effects of the disconnection on characteristics. Thus, there can be provided an advantage that the lead-out portion to the base electrode 57 does not need to be large sized. On the other hand, in the case where the base layer 54 is formed into a striped shape, all the stripes need to be in contact with the lead-out portion to the base electrode 57, in which case partial disconnection causes the stripes to no longer function.

(Sixth Embodiment)

FIG. 7 shows a cross-sectional structure of a PBT according to this embodiment. In FIG. 7, reference numeral 61 denotes a (0001) 6H-SiC substrate, 62 denotes an AlN buffer layer (film thickness: 20 nm), 63 denotes an n-type GaN contact layer, 64 denotes an n-type Al$_{0.3}$Ga$_{0.7}$N collector layer (carrier concentration: $5 \times 10^{16}$ cm$^{-3}$, film thickness: 0.5 μm), 65 denotes a NbN base layer (film thickness: 5 nm), 66 denotes an n-type Al$_{0.3}$Ga$_{0.7}$N emitter layer (carrier concentration: $1 \times 10^{17}$ cm$^{-3}$, film thickness: 0.2 μm), 67 denotes an n-type GaN contact layer, 68 denotes a collector electrode, 69 denotes a base electrode, and 70 denotes an emitter electrode.

As a crystal growth method for forming this layered structure, MOVPE process, MBE process using plasma-excited nitrogen, and the like are available. In this embodiment, the film structure was fabricated by RF-MBE process as in the fifth embodiment.

As a result, the maximum oscillating frequency was 60 GHz, which is a value several times larger than that of conventional W-GaAs based PBTs. This could be attributed to an improved crystallinity obtained by virtue of the fact that the nitride semiconductor layer as the emitter layer 66 was epitaxially grown without voids on the metal nitride as the buried base layer 65 for the same reason as in the fifth embodiment, and that the lattice constant (3.13 Å) of Al$_{0.3}$Ga$_{0.7}$N as the collector layer 64 and the emitter layer 66 is closer to the lattice constant (2.97 Å) of NbN as the base layer 65 than the lattice constant (3.16 Å) of GaN as the contact layers 63, 67.

(Seventh Embodiment)

FIG. 8 shows a cross-sectional structure of a PBT according to this embodiment. The PBT of this embodiment, although basically similar in structure to that of the sixth embodiment, differs therefrom in that a collector layer 74 is formed from n-type Al$_{0.6}$Gd$_{0.4}$N (carrier concentration: $5 \times 10^{16}$ cm$^{-3}$, film thickness: 0.5 μm), a base layer 75 is formed from ZrN (film thickness: 5 nm), and that an emitter layer 76 is formed from n-type Al$_{0.6}$Gd$_{0.4}$N (carrier concentration: $1 \times 10^{17}$ cm$^{-3}$, film thickness: 0.2 nm). It is noted that a substrate 71, a buffer layer 72, a contact layer 73, a contact layer 77, a collector electrode 78, a base electrode 79 and an emitter electrode 80 are similar in constitution to those of the sixth embodiment.

As a crystal growth method for forming this layered structure, MOVPE process, MBE process using plasma-excited nitrogen, and the like are available. In this embodiment, the film structure was fabricated by RF-MBE process.

As a result, the maximum oscillating frequency was 80 GHz, which is a value several times larger than that of conventional W-GaAs based PBTs. This could be attributed to the following reasons. That is, a spatially continuous crystal growth was enabled by virtue of the presence of the same constituent element (N) in the individual layers of the semiconductor layer (collector layer)/metal layer (base layer)/semiconductor layer (emitter layer). In addition to this, the (0001) plane (c plane) of lanthanoid-added AlGaInN whose crystal structure is a wurtzite structure, and the (111) plane of the metal nitride whose crystal structure is an halitic structure become the same close-packed planar structure so that the epitaxial relationship is satisfied. Therefore, lanthanoid-added AlGaInN as the emitter layer 76 was epitaxially grown without voids on the metal nitride as the buried base layer 75.

Further, in the case where AlGaInN with lanthanoid added thereto is used as the collector layer 74 and the emitter layer 76, the arbitrariness of band gap and lattice constant are increased as compared with AlGaInN layers, making it easier to form the lattice matching system. In the case of this embodiment, the reason that a large current amplification factor was obtained could be attributed to the fact that the lattice constant (3.26 Å) of the ZrN base layer 75 as a hexagonal, and the lattice constant (3.26 Å) of the n-type $Ga_{0.6}Gd_{0.4}N$ collector layer 74 and the n-type $Al_{0.6}Gd_{0.4}N$ emitter layer 76 were generally in a lattice matching.

(Eighth Embodiment)

Figure 9:
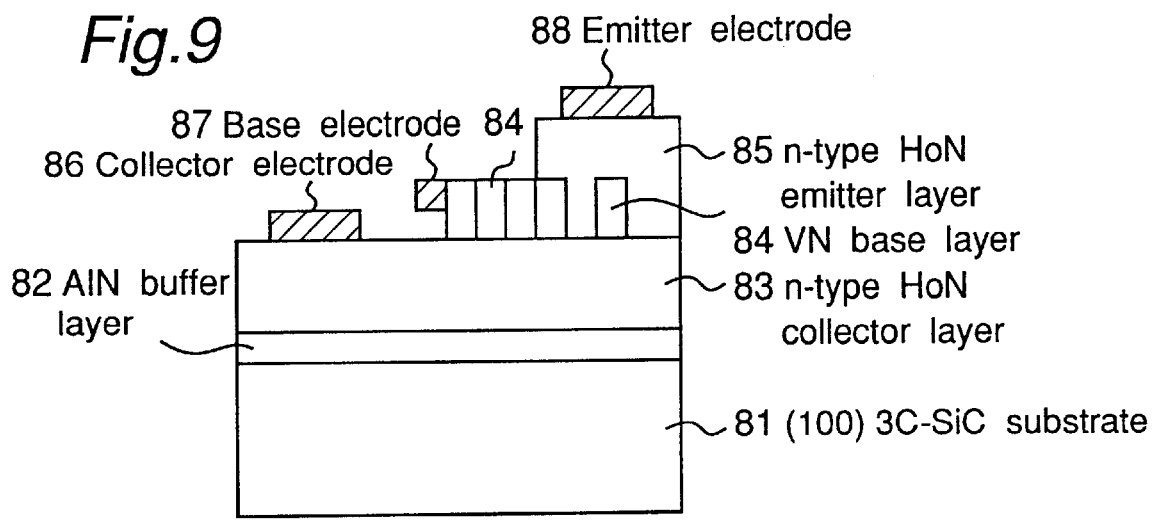
FIG. 9 is a sectional structural view of a PBT other than those of FIGS. 6 to 8.
Figure 10:
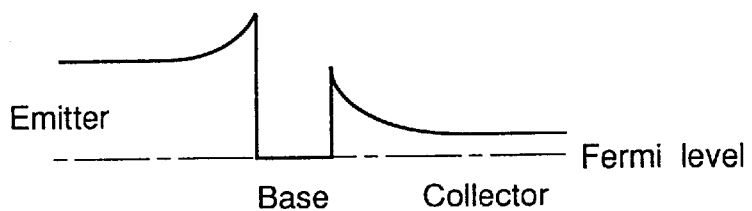
FIG. 10 is a chart showing the band structure of an MBT.
Figure 11:
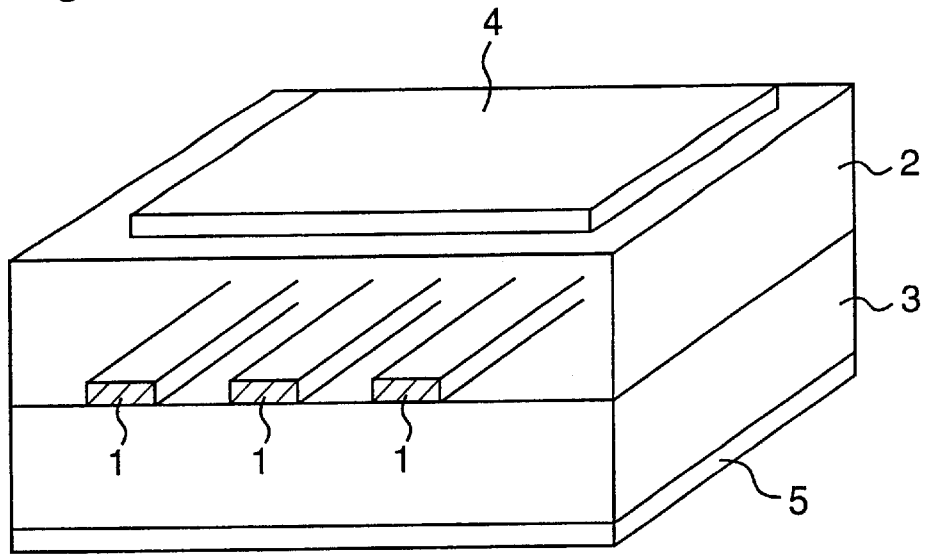
FIG. 11 is a sectional structural view of a PBT according to the prior art.
Figure 12:
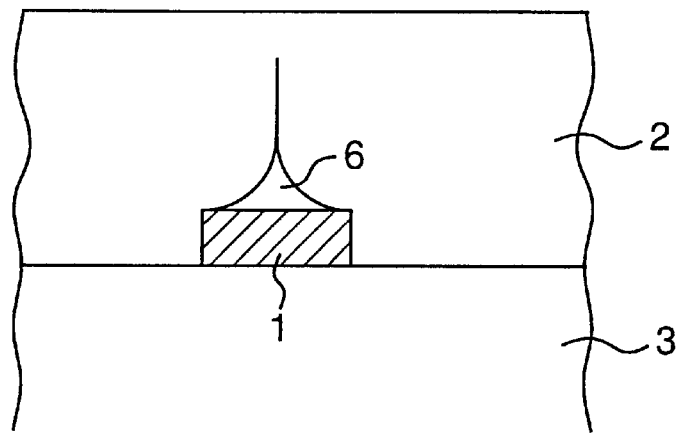
FIG. 12 is an enlarged sectional view in the vicinity of the base metal of FIG. 11.
Figure 13A:
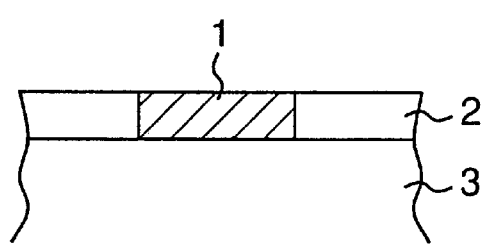
FIGS. 13A–13D are process views in which a void is formed on the metal layer.
Figure 13B:
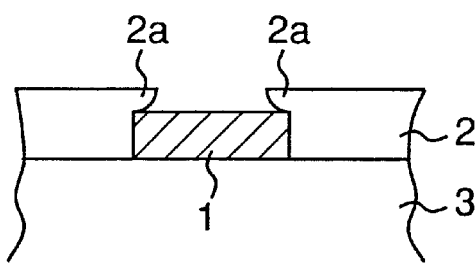
Figure 13C:
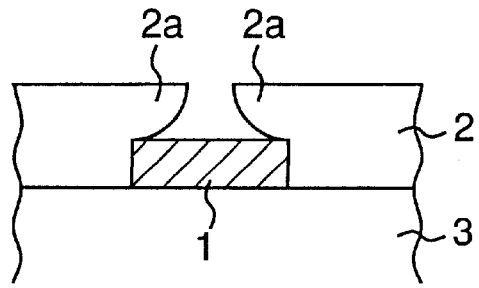
Figure 13D:
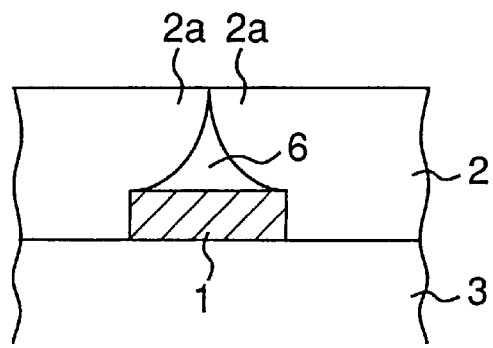

FIG. 9 shows a cross-sectional structure of a PBT according to this embodiment. In FIG. 9, reference numeral 81 denotes a (100)3C—SiC substrate, 82 denotes an AlN buffer layer (film thickness: 20 nm), 83 denotes an n-type HoN collector layer (carrier concentration: $5 \times 10^{16}$ cm$^{-3}$, film thickness: 0.5 μm), 84 denotes a VN base layer (film thickness: 5 nm), 85 denotes an n-type HoN emitter layer (carrier concentration: $5 \times 10^{16}$ cm$^{-3}$, film thickness: 100 nm), 86 denotes a collector electrode, 87 denotes a base electrode, and 88 denotes an emitter electrode.

In this embodiment, the film structure was fabricated by RF-MBE process. In HoN or VN as the collector layer 83 and the emitter layer 85 obtained in this embodiment, in which the (100) plane of the cubic SiC substrate is used, their (100) planes of the halitic structure are parallel to the substrate plane.

As a result, the maximum oscillating frequency was 100 GHz, which is a value several times larger than that of conventional W-GaAs based PBTs. This could be attributed to the fact that the nitride semiconductor layer as the emitter layer 85 was epitaxially grown without voids on the metal nitride as the buried base layer 84. Also, as in this embodiment, when the lanthanoid nitride as the collector layer 83 and the emitter layer 85, and the metal nitride as the base layer 84, are combined together, a more ideal crystal interface can be obtained by virtue of their perfect identicalness in crystal structure. This could be the cause of the large current amplification factor.

In addition, although results from using Ho as the lanthanoid are shown in this embodiment, similar effects were verified even with the use of lanthanoids other than Ho.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device which comprises a three-layer structure composed of a nitride-based compound semiconductor, a metal nitride and a nitride-based compound semiconductor.

2. The semiconductor device according to claim 1, wherein the metal nitride is formed into a striped shape.

3. The semiconductor device according to claim 1, wherein the metal nitride is formed into a meshed shape.

4. The semiconductor device according to claim 1, wherein metal of the metal nitride is at least one selected from among niobium, tantalum, chromium, zirconium, titanium and vanadium.

5. The semiconductor device according to claim 1, wherein the nitride-based compound semiconductor is AlGaInN with lanthanoid added thereto.

6. The semiconductor device according to claim 5, wherein the lanthanoid-added AlGaInN and the metal nitride are formed in such a way that a (0001) plane of the lanthanoid-added AlGaInN and a (111) plane of the metal nitride are parallel to each other.

7. The semiconductor device according to claim 1, wherein the nitride-based compound semiconductor is a nitride of lanthanoid.

8. The semiconductor device according to claim 5, wherein the lanthanoid is at least one selected from among lanthanum, cerium, praseodymium, neodymium, prometium, samarium, europium, gadolinium, terbium, dysprosium, holmium, erbium, thulium, ytterbium and lutetium.

9. The semiconductor device according to claim 7, wherein the lanthanoid is at least one selected from among lanthanum, cerium, praseodymium, neodymium, prometium, samarium, europium, gadolinium, terbium, dysprosium, holmium, erbium, thulium, ytterbium and lutetium.

* * * * *